(12) United States Patent
Graef

(10) Patent No.: US 8,375,281 B2
(45) Date of Patent: *Feb. 12, 2013

(54) METHOD AND APPARATUS FOR STORING SURVIVOR PATHS IN A VITERBI DETECTOR USING SYSTEMATIC POINTER EXCHANGE

(75) Inventor: Nils Graef, Allentown, PA (US)

(73) Assignee: Agere Systems LLC, Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/369,624

(22) Filed: Feb. 9, 2012

(65) Prior Publication Data

US 2012/0198316 A1 Aug. 2, 2012

Related U.S. Application Data

(62) Division of application No. 11/241,759, filed on Sep. 30, 2005, now Pat. No. 8,140,947.

(51) Int. Cl.
*H03M 13/03* (2006.01)
(52) U.S. Cl. ........ 714/795; 714/792; 714/794; 714/796; 375/262; 375/341
(58) Field of Classification Search .................. 714/792, 714/394–396; 375/262, 341
See application file for complete search history.

(56) References Cited

U.S. PATENT DOCUMENTS

| | | | |
|---|---|---|---|
| 5,996,112 A * | 11/1999 | Dabiri et al. | 714/795 |
| 6,334,201 B1 * | 12/2001 | Sawaguchi et al. | 714/795 |
| 6,598,205 B1 * | 7/2003 | Luetkemeyer | 714/795 |
| 6,680,986 B1 * | 1/2004 | Hemmati | 375/341 |
| 6,725,418 B2 * | 4/2004 | Sawaguchi et al. | 714/795 |
| 6,883,021 B2 | 4/2005 | Ahmed et al. | 709/213 |
| 7,003,718 B2 | 2/2006 | Luetkemeyer | 714/795 |
| 7,095,707 B2 | 8/2006 | Rakib et al. | 370/204 |
| 7,149,952 B2 * | 12/2006 | Markman | 714/792 |
| 7,167,531 B2 | 1/2007 | Greenberg et al. | 375/341 |
| 7,289,569 B2 | 10/2007 | Markman | 375/265 |
| 7,434,149 B2 * | 10/2008 | Shih et al. | 714/795 |
| 7,590,928 B2 * | 9/2009 | Chiang | 714/795 |
| 7,653,154 B2 | 1/2010 | Haratsch | 375/341 |
| 7,656,959 B2 | 2/2010 | Haratsch | 375/262 |
| 7,669,110 B2 | 2/2010 | Graef | |
| 7,702,991 B2 | 4/2010 | Haratsch | 714/796 |
| 8,032,818 B2 | 10/2011 | Graef | |

OTHER PUBLICATIONS

U.S. Appl. No. 11/241,760, filed Sep. 30, 2005, Graef.
U.S. Appl. No. 11/241,761, filed Sep. 30, 2005, Graef.

* cited by examiner

*Primary Examiner* — Esaw Abraham
(74) *Attorney, Agent, or Firm* — Ryan, Mason & Lewis, LLP

(57) ABSTRACT

A survivor path memory is provided for a Viterbi detector. The survivor path memory comprises a plurality of columns, each associated with a different time step, and an input processor. Each column comprises a flip flop for storing one bit or portion of a bit sequence associated with a Viterbi state; and a multiplexer for each state controlled by a case signal indicating a time step, the multiplexer selecting a state from a previous time step, wherein an output of the multiplexer of a given state is connected to at least one data input of a flip flop of the given state. The input processor generates a control signal that exchanges one or more pointers based on a trellis structure, wherein each of the pointers points to one of the flip flops.

8 Claims, 14 Drawing Sheets

| 1 OUT OF 4 INPUTS | REQUIRED CONNECTIONS |
|---|---|
| a | a → B<br>a → C<br>a → D |
| b | b → A<br>b → C<br>b → D |
| c | c → A<br>c → B<br>c → D |
| d | d → A<br>d → B<br>d → C |

| 2 OUT OF 4 INPUTS | REQUIRED CONNECTIONS PAIRS |
|---|---|
| a, b | a → C, b → D <br> a → D, b → C (#) |
| a, c | a → B, c → D <br> a → D, c → B (#) |
| a, d | a → B, d → C (#) <br> a → C, d → B (#) |
| b, c | b → A, c → D (#) <br> b → D, c → A (#) |
| b, d | b → A, d → C <br> b → C, d → A (#) |
| c, d | c → A, d → B <br> c → B, d → A (#) |

FIG. 22

| NUMBER OF CONSOLIDATED CLOCK CYCLES | MAXIMUM NUMBER OF COPY OPERATIONS FOR EACH GROUP OF CONSOLIDATED CLOCKS CYCLES | SWITCHING ACTIVITY REDUCTION FOR WORST CASE | CROSSBAR TYPE |
|---|---|---|---|
| 1 | 2 PER 1 CLOCK CYCLE | 0% | FIG. 14 |
| 2 | 3 PER 2 CLOCK CYCLES | 25% | FIG. 14 |
| 3 | 3 PER 3 CLOCK CYCLES | 50% | FIG. 17 |
| 4 | 3 PER 4 CLOCK CYCLES | 62.5% | FIG. 17 |

FIG. 23

| NUMBER OF CONSOLIDATED CLOCK CYCLES | MAXIMUM NUMBER OF COPY OPERATIONS FOR EACH GROUP OF CONSOLIDATED CLOCKS CYCLES | MAXIMUM NUMBER OF COPY OPERATIONS THE CROSSBAR MUST BE ABLE TO PERFORM PER EACH CLOCK CYCLE |
|---|---|---|
| 1 | 4 PER 1 CLOCK CYCLE | 4 |
| 2 | 6 PER 2 CLOCK CYCLES | 3 |
| 3 | 7 PER 3 CLOCK CYCLES | 3 |
| 4 | 7 PER 4 CLOCK CYCLES | 2 |
| 5 | 7 PER 5 CLOCK CYCLES | 2 |
| 6 | 7 PER 6 CLOCK CYCLES | 2 |
| 7 | 7 PER 7 CLOCK CYCLES | 1 |

METHOD AND APPARATUS FOR STORING SURVIVOR PATHS IN A VITERBI DETECTOR USING SYSTEMATIC POINTER EXCHANGE

CROSS-REFERENCE TO RELATED APPLICATIONS

This application is a divisional of U.S. patent application Ser. No. 11/241,759, filed Sep. 30, 2005, which issued on Mar. 20, 2012 as U.S. Pat. No. 8,140,947, incorporated by reference herein.

FIELD OF THE INVENTION

The present invention relates generally to Viterbi detection techniques and, more particularly, to the techniques for storing survivor paths in a Viterbi detector.

BACKGROUND OF THE INVENTION

A magnetic recording read channel converts an analog read signal into an estimate of the user data recorded on a magnetic medium. Read heads and magnetic media introduce noise and other distortions into the read signal. As the information densities in magnetic recording increase, the intersymbol interference (ISI) becomes more severe as well, (i.e., the channel impulse response becomes longer). In a read channel chip, a Viterbi detector is often employed to detect the read data bits in the presence of intersymbol interference and noise.

Generally, Viterbi detectors employ maximum-likelihood decoding of convolutional codes to determine the shortest path through a code trellis. Viterbi detectors use the trellis structure and determine the maximum-likelihood estimate of the transmitted sequence. A survivor path is identified that is the most likely path having the largest accumulated metric through the trellis. The metric of all paths entering each state are compared and the survivor with the largest accumulated metric is maintained at each state.

A conventional Viterbi decoder 100, shown in FIG. 1, typically comprises a branch metric unit (BMU) 110, an add/compare/select unit (ACSU) 120, a survivor path memory unit (SPM) 130 and a decision feedback unit (DFU) 140. For a detailed discussion of conventional Viterbi decoders, see, for example, Borivoje Nikolic et al., "Read/Write Channel Implementation," in Coding and Signal Processing for Magnetic Recording Systems, CRC Press, (2005, Bane Vasic and Erozan M. Kuratas editors), incorporated by reference herein.

Generally, as shown in FIG. 1, the decision-feedback unit 140 computes separate ISI estimates for each trellis state, the branch metric unit 110 computes branch metrics for all transitions, the add-compare-select unit 120 determines the best survivor path into each state, and the survivor path memory 130 stores the survivor paths.

Typically, a survivor path memory unit implements a register-exchange or trace-back architecture to generate the survivor symbols for each state. In a register-exchange survivor memory implementation, survivor symbols for each state are stored and updated at each detection step. In a trace-back implementation, ACS decisions are stored as pointers in a memory, and the detected symbols are obtained by tracing back the pointers that correspond to a survivor path.

The trace-back architecture does not require the updating of all survivor symbols at each detection step. Thus, the trace-back architecture is associated with less power consumption than the register-exchange architecture. The trace-back architecture, however, is associated with larger detection latency and therefore is generally not suitable for most Viterbi detection applications. The register exchange algorithm exhibits higher dynamic power consumption than the trace-back algorithm, because the register exchange algorithm requires one flip flop for each memory bit, and the whole memory contents is updated in each clock cycle of the register exchange algorithm, resulting in higher switching activity. The trace-back, on the other hand, only updates N memory bits in each clock cycle for an N-state radix-2 trellis.

A need therefore exists for an improved register exchange algorithm that features lower switching activity and power consumption.

SUMMARY OF THE INVENTION

Generally, methods and apparatus are provided for storing survivor paths in a Viterbi detector. According to one aspect of the invention, at least one register and at least one pointer are maintained for each state. Each register stores a bit sequence associated with a Viterbi state and each pointer points to one of the registers. One or more predefined rules based on a trellis structure are employed to exchange one or more of the pointers. The trellis structure can optionally be transformed to comprise one or more butterfly trellises. In a further variation, the trellis structure can be collapsed to combine a plurality of steps into a single step.

According to another aspect of the invention, a survivor path memory is disclosed for a Viterbi detector. The survivor path memory comprises a plurality of columns, each associated with a different time step, and an input processor. Each column comprises a flip flop for storing one bit or portion of a bit sequence associated with a Viterbi state; and a multiplexer for each state controlled by a case signal indicating a time step, the multiplexer selecting a state from a previous time step, wherein an output of the multiplexer of a given state is connected to at least one data input of a flip flop of the given state. The input processor generates a control signal that exchanges one or more pointers based on a trellis structure, wherein each of the pointers points to one of the flip flops.

A more complete understanding of the present invention, as well as further features and advantages of the present invention, will be obtained by reference to the following detailed description and drawings.

BRIEF DESCRIPTION OF THE DRAWINGS

FIG. 22 is a table summarizing the advantages of the multi-step trellis collapsing; and FIG. 23 is a table illustrating a trellis collapsing for an exemplary 8-state trellis.

DETAILED DESCRIPTION

The present invention reduces the dynamic power consumption of a survivor path memory implementing the register exchange algorithm for certain states. According to one aspect of the invention, power consumption is improved by exchanging pointers to registers instead of exchanging the contents of the registers. The pointer exchange (PE) is done systematically and independent of the survivor path memory input. While the pointer exchange may not completely replace all required register exchange operations, it reduces the number of required register exchange operations and thus the overall dynamic power consumption.

Register Exchange

Figure 1:
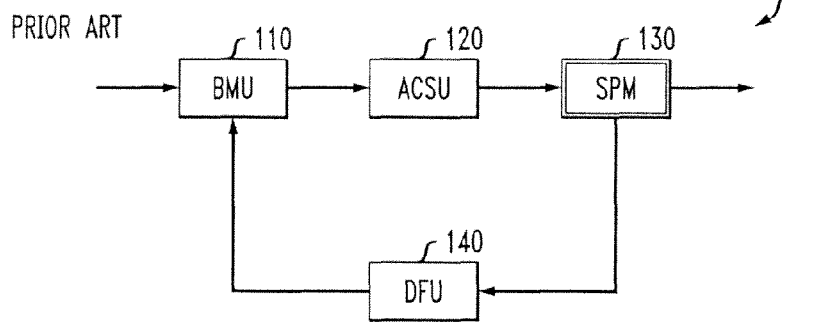
FIG. 1 is a schematic block diagram of a conventional Viterbi decoder.
Figure 2:
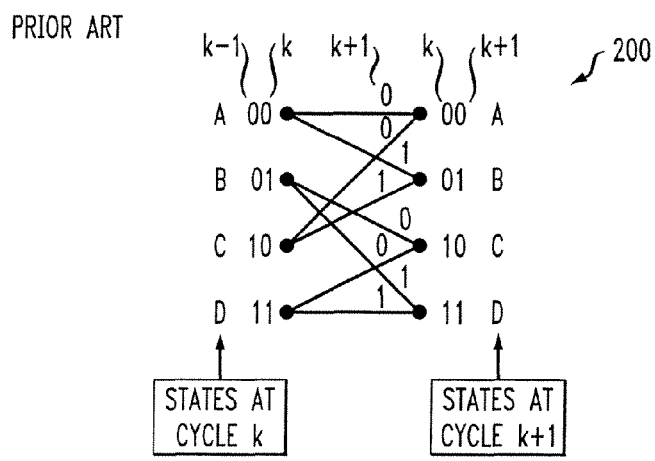
FIG. 2 illustrates an exemplary radix-2 trellis for a 4-state Viterbi detector.

As previously indicated, a register-exchange survivor memory implementation stores and updates survivor symbols for each state at each detection step. FIG. 2 illustrates an exemplary radix-2 trellis 200 for a 4-state Viterbi detector. As shown in FIG. 2, the trellis 200 defines the transitions between the states at cycle k and the states at cycle k+1.

The input signal to the SPM 130, acsu[3:0], is the output signal from the ACSU 120. The acsu signal encodes the selections made by the ACSU 120, as follows:

acsu[A] specifies the survivor branch selection made by the ACSU for State A:
  If acsu[A]==TOP (indicating that the top branch is the survivor branch), then the ACSU has selected the "top" branch that enters State A at cycle k+1, i.e., the branch A(k)→A(k+1), see FIG. 2.
  If acsu[A]==BOT (indicating that the bottom branch is the survivor branch), then the ACSU has selected the "bottom" branch that enters State A at cycle k+1, i.e., the branch C(k)→A(k+1), see FIG. 2.

acsu[B] specifies the survivor branch selection made by the ACSU for State B:
  If acsu[B]==TOP, then the ACSU has selected the "top" branch that enters State B at cycle k+1, i.e., the branch A(k)→B(k+1), see FIG. 2.
  If acsu[B]==BOT, then the ACSU has selected the "bottom" branch that enters State B at cycle k+1, i.e., the branch C(k)→B(k+1), see FIG. 2.

acsu[C] specifies the survivor branch selection made by the ACSU for State C:
  If acsu[C]==TOP, then the ACSU has selected the "top" branch that enters State C at cycle k+1, i.e., the branch B(k)→C(k+1), see FIG. 2.
  If acsu[C]==BOT, then the ACSU has selected the "bottom" branch that enters State C at cycle k+1, i.e., the branch D(k)→C(k+1), see FIG. 2.

acsu[D] specifies the survivor branch selection made by the ACSU for State D:
  If acsu[D]==TOP, then the ACSU has selected the "top" branch that enters State D at cycle k+1, i.e., the branch B(k)→D(k+1), see FIG. 2.
  If acsu[D]==BOT, then the ACSU has selected the "bottom" branch that enters State D at cycle k+1, i.e., the branch D(k)→D(k+1), see FIG. 2.

According to the conventional register exchange algorithm, the survivor path memory (SPM) 130 is implemented as four registers, labeled Register A through Register D. Register i (where i ∈ {A,B,C,D}) contains the bit-sequence of the survivor path of State i. At every clock cycle, the four registers are updated as follows:

Register A is updated based on the input signal acsu[A]:
  If acsu[A]==TOP, then the bit-sequence contained in register A is shifted left by one bit and "0" is appended to the right-hand end of the register.
  If acsu[A]==BOT, then the bit-sequence contained in register C is copied to register A and shifted left by one bit and "0" is appended to the right-hand end of the register.

Register B is updated based on the input signal acsu[B]:
  If acsu[B]==TOP, then the bit-sequence contained in register A is copied to register B and shifted left by one bit and "1" is appended to the right-hand end of the register.
  If acsu[B]==BOT, then the bit-sequence contained in register C is copied to register B and shifted left by one bit and "1" is appended to the right-hand end of the register.

Register C is updated based on the input signal acsu[C]:
  If acsu[C]==TOP, then the bit-sequence contained in register B is copied to register C and shifted left by one bit and "0" is appended to the right-hand end of the register.
  If acsu[C]==BOT, then the bit-sequence contained in register D is copied to register C and shifted left by one bit and "0" is appended to the right-hand end of the register.

Register D is updated based on the input signal acsu[D]:
  If acsu[D]==TOP, then the bit-sequence contained in register B is copied to register D and shifted left by one bit and "1" is appended to the right-hand end of the register.
  If acsu[D]==BOT, then the bit-sequence contained in register D is shifted left by one bit and "1" is appended to the right-hand end of the register.

Figure 3:
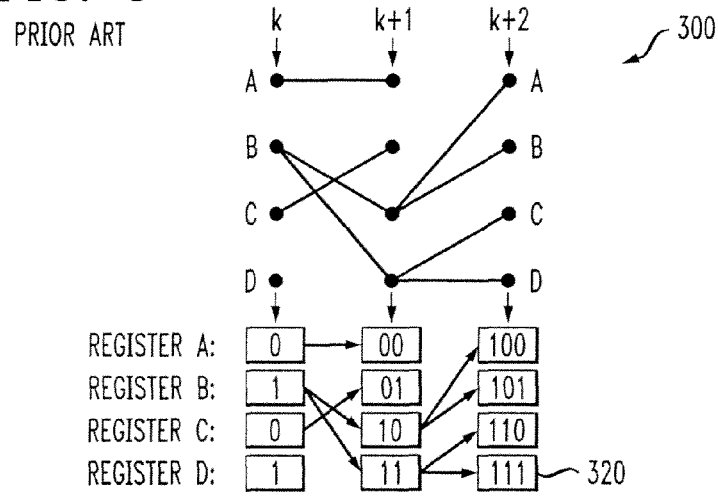
FIG. 3 is an exemplary trellis for illustrating the register exchange algorithm.

FIG. 3 is an exemplary trellis 300 for illustrating the register exchange algorithm. There are several possible schemes for generating the output of the SPM 130, as follows:

Assume that the survivor paths of all states always converge after L clock cycles (where L is the depth of the survivor path memory). Thus, the four registers will always have identical values at their left-most positions. So the SPM output equals the left-most bit of any register, e.g., Register A.

If this assumption is not accurate, then there are two ways to generate the output of the SPM 130:
The output of the SPM 130 equals the leftmost bit of the register whose associated survivor path has the largest path metric.
The output of the SPM 130 equals the average across the four leftmost bits of the four registers, A through D, rounded to the nearest integer 0 or 1.

A. Hardware Implementation

For a detailed discussion of conventional hardware implementations of the register exchange algorithm, see, for example, Borivoje Nikolic et al., "Read/Write Channel Implementation," in Coding and Signal Processing for Magnetic Recording Systems, CRC Press, (2005, Bane Vasic and Erozan M. Kuratas editors).

Figure 4:
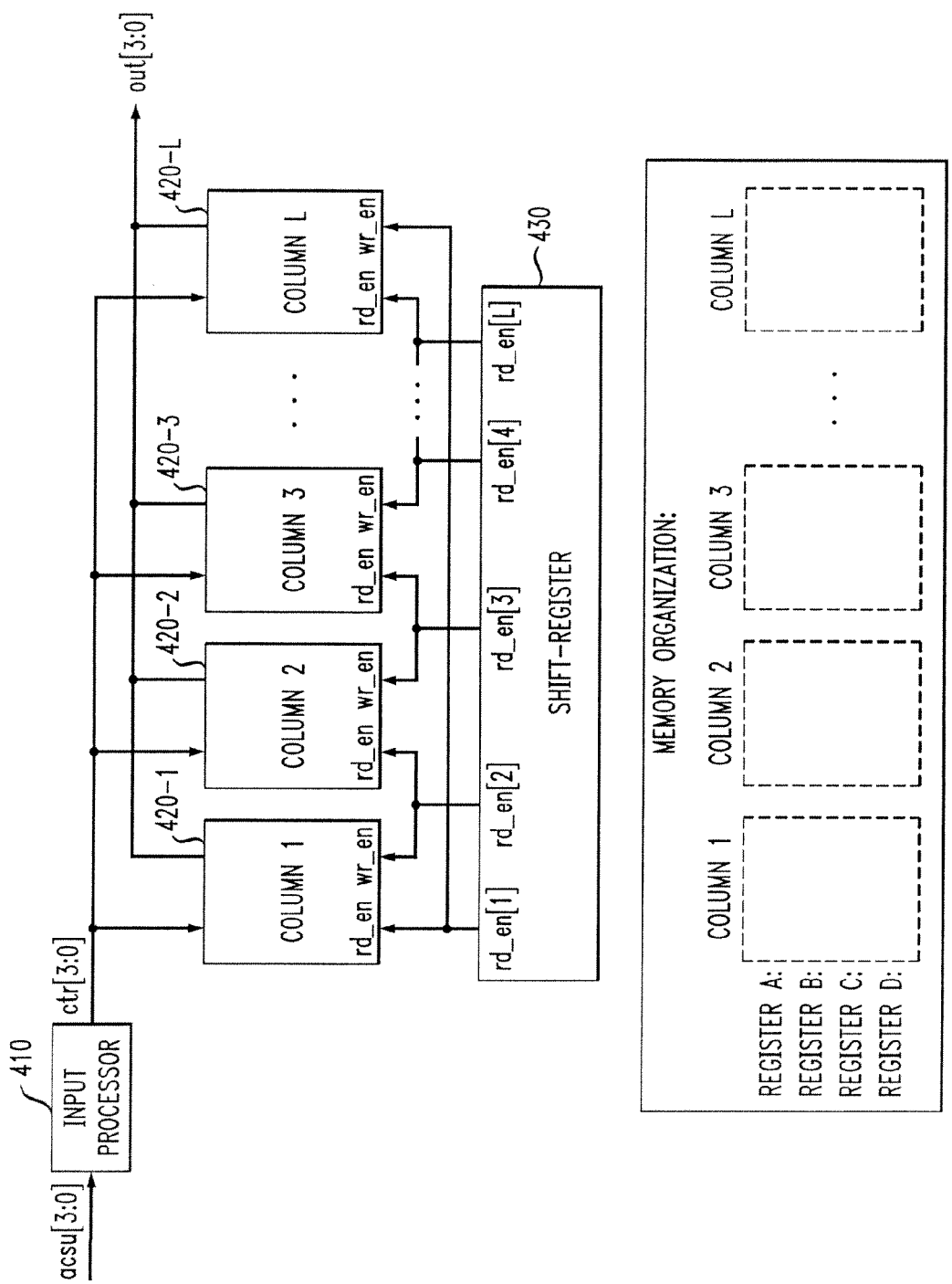
FIG. 4 is a block diagram of an exemplary hardware implementation of the register exchange algorithm for a 4-state radix-2 SPM.
Figure 5:
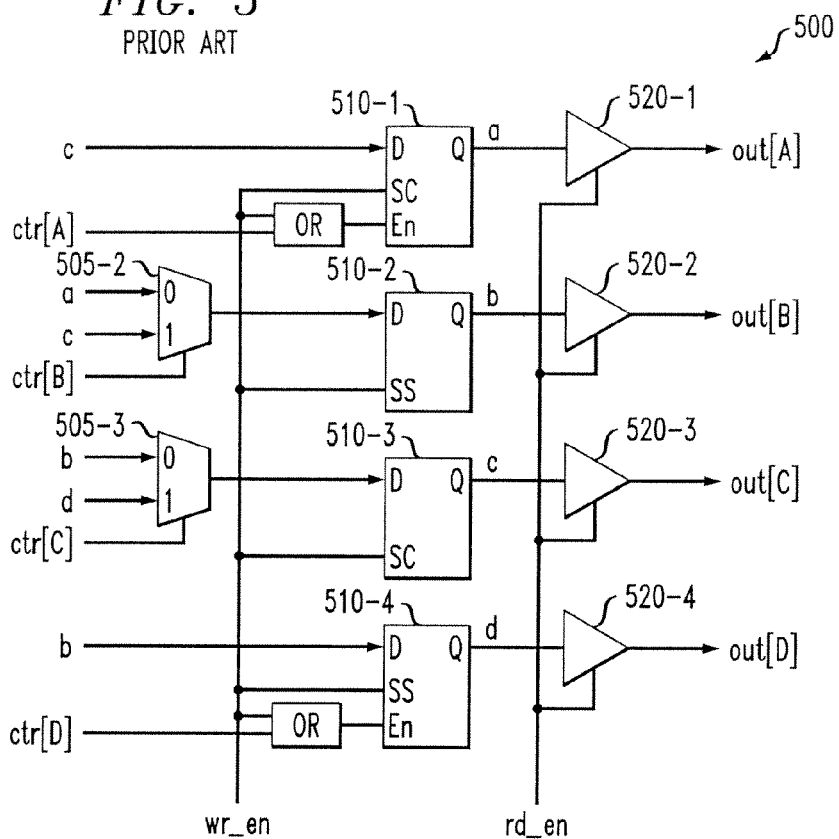
FIG. 5 thus illustrates one column of the SPM of FIG. 4.

FIG. 4 is a block diagram of an exemplary hardware implementation of the register exchange algorithm for a 4-state radix-2 SPM 400. As shown in FIG. 4, the exemplary SPM 400 comprises an input processor 410, a plurality of memory columns 420-1 through 420-L and a shift-register 430. The shift-left operation is implemented without actually shifting data from one flip-flop to another but by rotating the read and write "pointers" (i.e., rd_en and wr_en), which is done by the shift-register 430. The SPM 400 is organized in columns, each implemented as shown in FIG. 5. FIG. 5 thus illustrates one column of the SPM 400 of FIG. 4. It is noted that although the connections are not shown in FIG. 5, the inputs a, b, c, d shown on the left of FIG. 5 are actually connected to the outputs of the flip-flops 510-1 through 510-4, which are also labeled a, b, c, d, respectively. It is noted that the flip flips 510 may alternatively be implemented as another memory element type, such as a latch, transistor logic, processor logic, or other types of gates.

It is noted that the four flip-flops 510-1 through 510-4 represent, e.g., the four states A, B, C, D of one trellis stage of the trellis shown in FIG. 3. As shown in FIG. 5, if wr_en equals 1, then the four flip-flops 510 (a, b, c, d) are set to a=0, b=1, c=0, d=1. Otherwise, (i.e., if wr_en equals 0), then the flip-flops 510 are controlled by signal ctr[3:0] provided by the input processor 410.

The input processor 410 generates the ctr[3:0] signal for the memory columns 420 as follows:
ctr[A]=(acsu[A]==BOT)
ctr[B]=(acsu[B]==BOT)
ctr[C]=(acsu[C]==BOT)
ctr[D]=(acsu[D]==TOP)

It is noted that the clock inputs of flip-flops a and d can be gated by their respective enable signal to reduce the switching activity at the clock inputs of the flip-flops.

The differences between the implementation of FIGS. 4 and 5 and the one shown by Borivoje Nikolic et al., referenced above, are as follows:
Lower switching activity for registers A and D, because these registers are not enabled in the case that ctr[A]==0 or ctr[D]==1, respectively.
Each N-state column 420 requires N additional tri-state buffers 520, but it also saves two multiplexers 505 compared with the implementations of Borivoje Nikolic et al. It is also noted that, if it can be assumed that the survivor paths of all states always converge after L clocks, then only one tri-state buffer 520 (instead of N) is required for each N-state column.
An additional control shift-register 430 is required.

It is noted that the inputs to the flip flops 510 comprise synchronized set (SS), synchronized clear (SC) and enable (EN).

B. Dynamic Power Consumption

The dynamic power consumption of the four flip-flops a, b, c, d in FIG. 5 is proportional to their individual switching activities $\alpha_a, \alpha_b, \alpha_c, \alpha_d$, which are derived in the following:
Flip-flop a only switches if its enable signal is 1 (i.e., acsu[A]==BOT) and if c≠a. With the assumptions that p(c≠a)=0.5 and p(acsu[A]==BOT)=0.5, the switching activity for flip-flop a yields $\alpha_a$=0.25, where p(event) is the probability that the event occurs.
Similar considerations for flip-flop d yields $\alpha_d$=0.25.
Flip-flop b is always enabled. It is switched in the following two cases:
if acsu[B]==BOT and c≠b
or if acsu[B]==TOP and a≠b
So with the following assumptions:
p(acsu[B]==BOT)=p(acsu[B]==TOP)=0.5 and p(c≠b)=p(a≠b)=0.5
$\alpha_b$=0.5·0.5+0.5·0.5=0.5.
Similar considerations for flip-flop c yield $\alpha_c$=0.5.
With the above assumptions, the total switching activity for a 4-state SPM of depth L equals 1.5·L.

According to one aspect of the present invention, the dynamic power can be reduced by a) reducing the switching activities of the flip-flops; and b) replacing the flip-flops with latches in order to reduce area and the lumped capacitances being switched. It is noted that the dynamic power consumption is also proportional to the switched capacitances. It is further noted that, for the register exchange implementation of Borivoje Nikolic et al. and the one shown in FIGS. 4 and 5, it is not possible to implement each register element by a latch instead of a flip flop.

Systematic Pointer Exchange

Embodiments of the present invention provides a pointer exchange scheme with lower switching activity than conventional register exchange algorithms.

A. 4-State Radix-2

Figure 6:
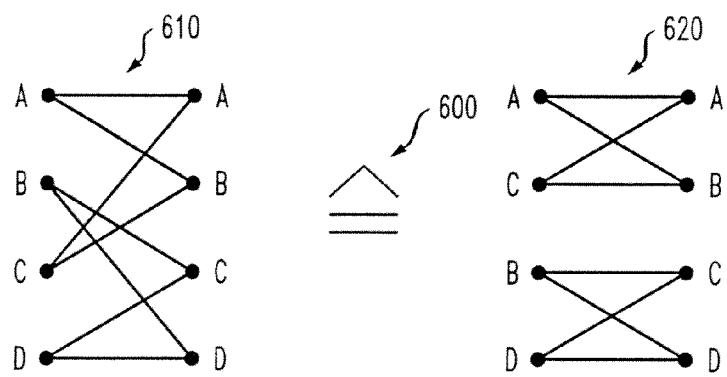
FIG. 6 illustrates a butterfly transformation of a 4-state radix-2 trellis, in accordance with the present invention.

FIG. 6 illustrates a butterfly transformation 600 of a 4-state radix-2 trellis, in accordance with one embodiment of the present invention. This particular embodiment provides a systematic pointer exchange scheme based on the transformed trellis 620. Generally, the disclosed systematic pointer exchange scheme reduces switching activity by exchanging pointers rather than register contents.

As shown in FIG. 6, the four pointers A, B, C, D initially point to the registers a, b, c, d. It is noted that the pointers A and D are not updated and will always point to register a and d, respectively.

Figure 7:
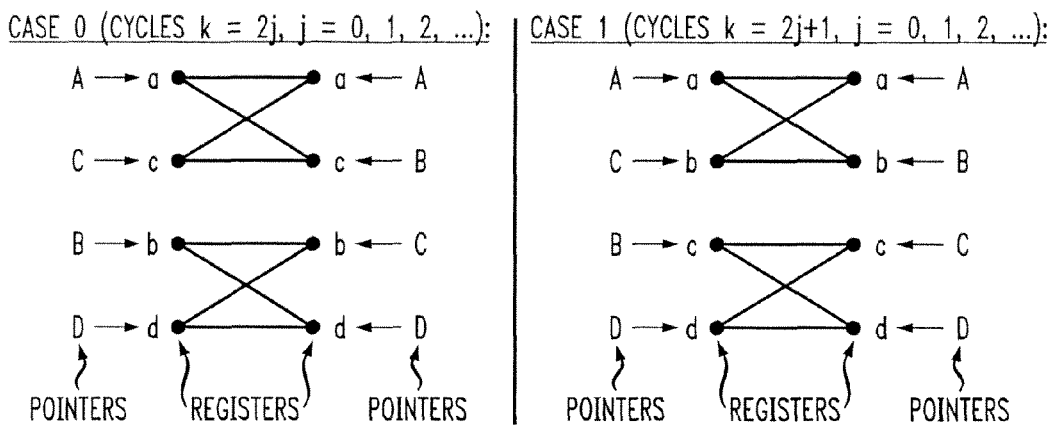
FIG. 7 illustrates the pointer exchange scheme incorporating features of the present invention.

FIG. 7 illustrates the pointer exchange scheme incorporating features of the present invention. As shown on the left of FIG. 7, at the end of the first clock cycle, k=0, (and all even cycles k=2, 4, . . . ), referred to as Case 0, the pointers B and C are updated as follows:
pointer B now points to register c
pointer C now points to register b Thus, the switching activity for registers b and c is reduced as follows. For the conventional register exchange algorithm, register b is always loaded, either with the contents of register a or register c, resulting in the switching activity $\alpha_b$=0.5, as discussed above. Now for the pointer exchange scheme of the present invention, register c is only loaded in half of the cases.

The contents of register c is only switched if (acsu[B]==TOP) and c≠a, resulting in a switching activity of $\alpha_c$=0.25 for Case 0, provided that p(c≠a)=0.5 and p(acsu[B]==TOP)=0.5. Similar considerations hold for register b, resulting $\alpha_b$=0.25 for Case 0.

As shown on the right side of FIG. 7, at the beginning of the second clock cycle, k=1, (and all odd cycles k=1, 3, . . . ), referred to as Case 1, the pointers are set as they were set at the end of the previous cycle, i.e., pointer B points to register c and pointer C points to register b. At the end of this cycle, however, the pointers B and C are updated as follows:

a pointer B now points to register b pointer C now points to register c

The above considerations for Case 0 can also be applied for this Case 1, yielding identical switching activities for Case 1.

FIG. 7 illustrates the two cases Case 0 and Case 1 for the systematic pointer exchange of the present invention. For example, B→c means that pointer B points to register c, i.e., register c contains the bit-sequence associated with Viterbi State B. In other words, register B of the conventional register exchange algorithm discussed above and register d of the SPE (systematic pointer exchange) contain identical data.

As shown by the example of FIG. 7, the systematic pointer exchange features a total switching activity of L (instead of 1.5·L) for a 4-state SPM of depth L (i.e., a reduction of 33%).

B. Systematic Pointer Exchange Hardware Implementation

Figure 8:
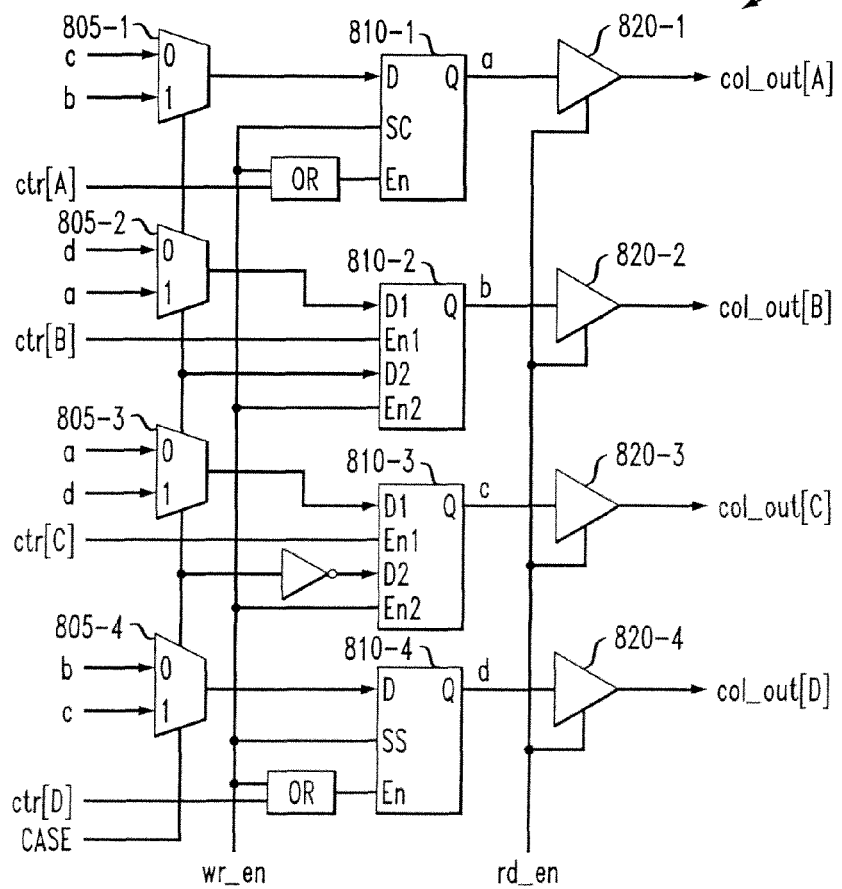
FIG. 8 illustrates a hardware implementation of an exemplary SPM column.

FIG. 8 illustrates a hardware implementation 800 of an exemplary SPM Column. The signal labeled "case", encodes the case, i.e., it is 0 for all even cycles k=0, 2, 4 . . . (Case 0) and 1 for all odd cycles k=1, 3, 5, . . . (Case 1). The SPM column 800 is comprised of a plurality of multiplexers 805, flip flops 810 and tri-state buffers 820, in a similar manner to FIG. 5. It is noted that the inputs to the flip flops 810 comprise synchronized set (SS), synchronized clear (SC), enable (EN), enable for D1 (EN1) and enable for D2 (EN2). Enable for D2 (EN2) has precedence over enable for D1 (EN1). It is noted that the multiplexers 805 may alternatively be implemented using another type of switch or crossbar device.

If the signal wr_en==1, then the flip-flops a and d (810-1 and 810-4) are set to a=0 and d=1, and the flip-flops b and c (810-2 and 810-3) are set based on the case signal:

b=(case==0)?0:1, so b=case c=(case==0)?1:0, so c=!case

If wr_en==0, then the flip-flops 810 are controlled by the ctr[3:0] signal and the case signal provided by the input processor (not shown in FIG. 8).

The input processor generates the ctr[3:0] signal for the memory columns as follows:

ctr[A]=(acsu[A]==BOT)

ctr[B]=(case==0)?(acsu[C]==BOT):(acsu[B]==TOP)

ctr[C]=(case==0)?(acsu[B]==TOP):(acsu[C]==BOT)

ctr[D]=(acsu[D]==TOP)

It is noted that the clock inputs of all four flip-flops 810 can be gated by their enable signal so as to reduce the switching activity at the clock inputs of the flip-flops 810.

In addition, an output processor (not shown in FIG. 8) generates the output out[3:0] from FIG. 4 based on the output signal col_out[3:0] of the Columns, as follows:

out[A]=col_out[A]

out[B]=col_out[(case 32 =0)?C:B]

out[C]=col_out[(case==0)?B:C]

out[D]=col_out[D]

It is noted that only one such output processor is needed, which is shared among all columns.

C. 8-State Radix-2

Figure 9:
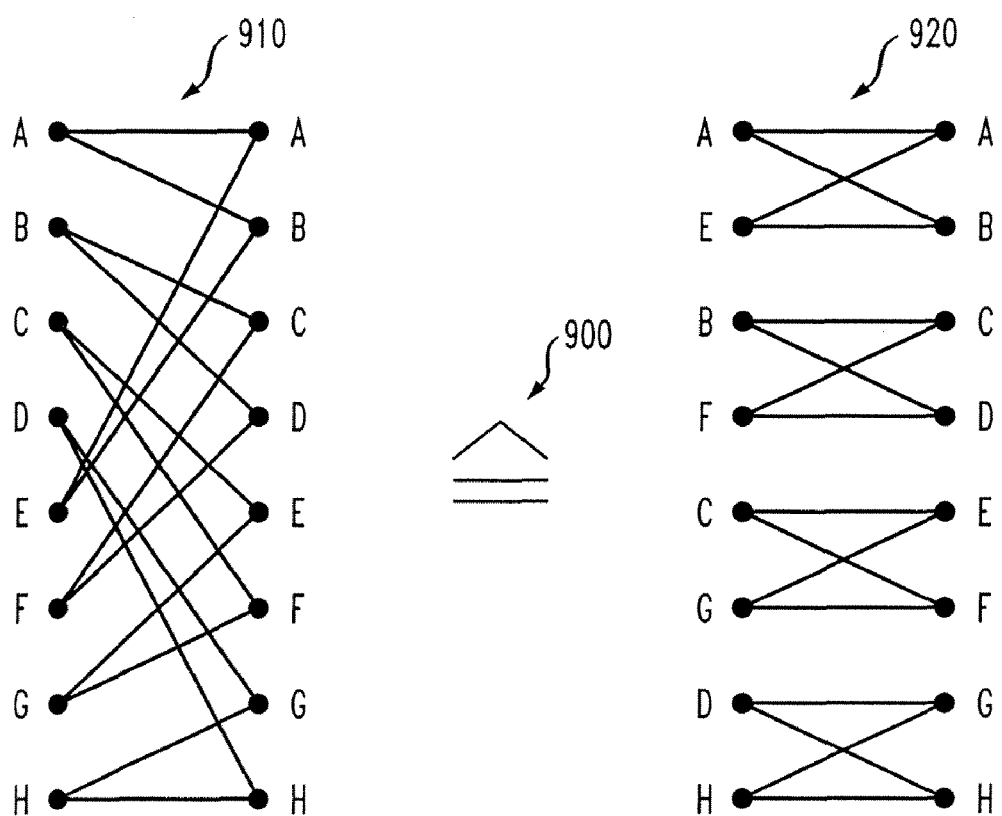
FIG. 9 illustrates a butterfly transformation of an 8-state radix-2 trellis, in accordance with the present invention.

FIG. 9 illustrates a butterfly transformation 900 of an 8-state radix-2 trellis, in accordance with the present invention. The present invention provides a systematic pointer exchange scheme based on the transformed trellis 920. As shown in FIG. 9, the eight pointers A through H initially point to the corresponding registers a through h.

Figure 10:
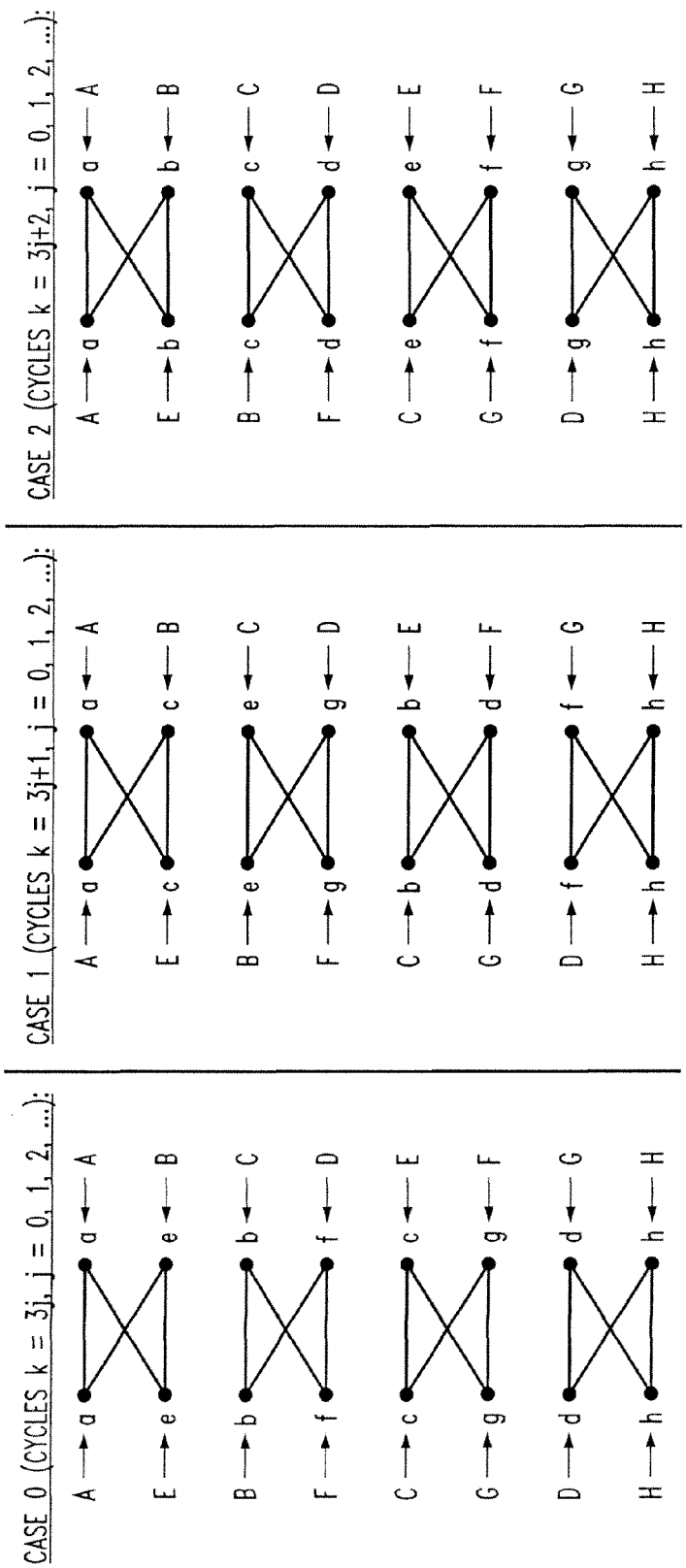
FIG. 10 illustrates the pointer exchange scheme incorporating features of the present invention for the transformed trellis of FIG. 9.

FIG. 10 illustrates the pointer exchange scheme incorporating features of the present invention for the transformed trellis 920 of FIG. 9. As shown in FIG. 10, there are three cases, Case 0 through Case 2, for the transformed trellis 920 of FIG. 9.

Figure 11:
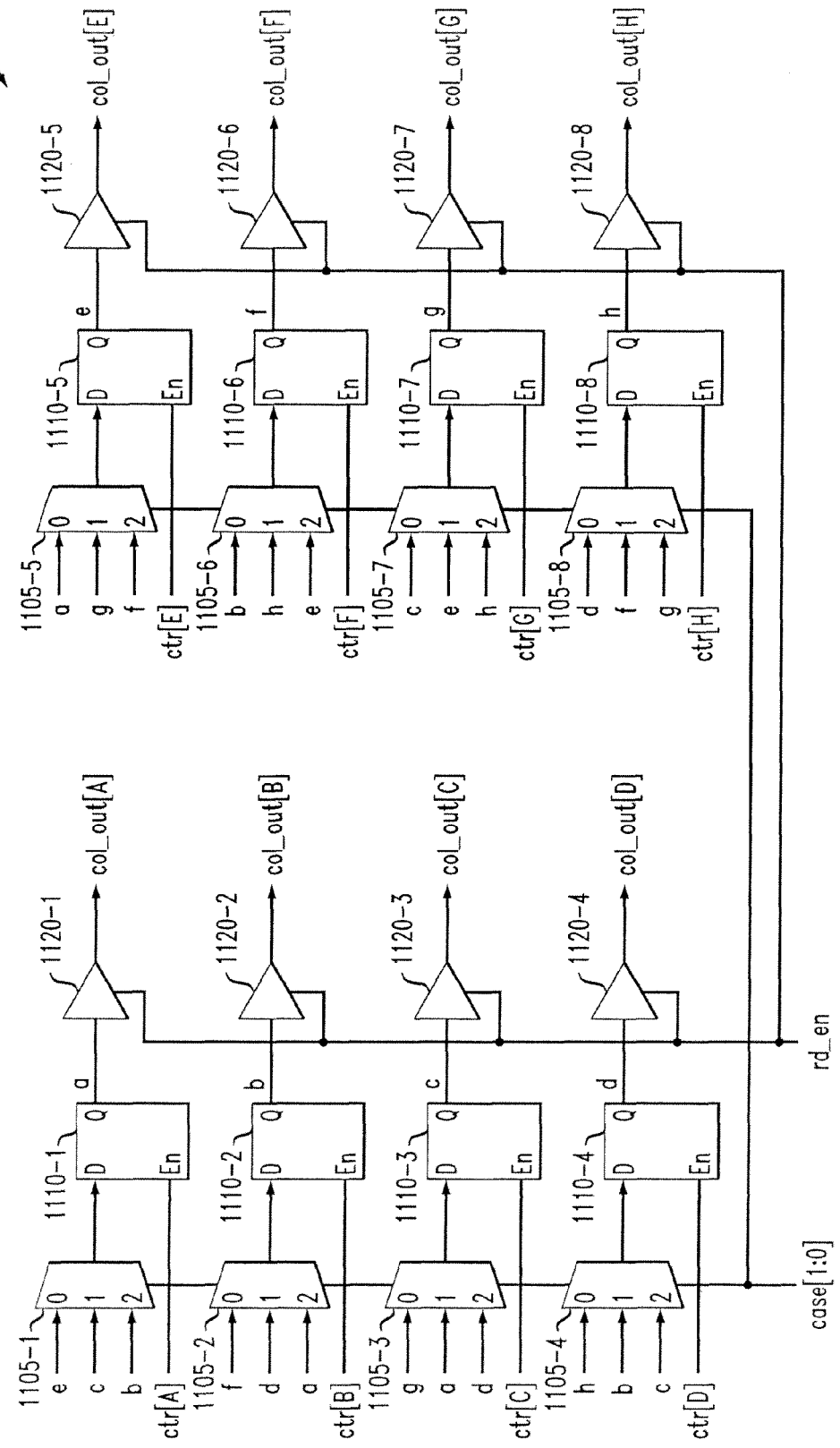
FIG. 11 illustrates an exemplary hardware implementation of an 8-state SPM column.

FIG. 11 illustrates an exemplary hardware implementation of an 8-state SPM Column 1100. The SPM column 1100 is comprised of a plurality of multiplexers 1105, flip flops 1110 and tri-state buffers 1120, in a similar manner to FIGS. 5 and 8. For ease of illustration, FIG. 11 does not include the logic associated with the input wr_en that is used to write 0 or 1 (depending on the Case) to the flip-flops. One skilled in the art will appreciate, however, that a typical hardware implementation, such as the one illustrated in FIG. 11, will include this logic. The signal case[1:0] encodes the case, i.e., case[1:0]= 2'd 0 for the cycles associated with Case 0, case[1:0]=2'd 1 for the cycles associated with Case 1, and case[1:0]=2'd 2 for the cycles associated with Case 2, as shown in FIG. 10.

If wr_en==0, then the flip-flops 1110 are controlled by the ctr[7:0] signal and the case[1:0] signal provided by the input processor. The input processor generates the ctr[7:0] signal as follows:

$$ctr[A] = (acsu[A] == BOT)$$

$$ctr[B] = \begin{cases} (acsu[C] == BOT): & \text{for case}[1:0] == 2'd\,0 \\ (acsu[E] == BOT): & \text{for case}[1:0] == 2'd\,1 \\ (acsu[B] == TOP): & \text{for case}[1:0] == 2'd\,2 \end{cases}$$

$$ctr[C] = \begin{cases} (acsu[E] == BOT): & \text{for case}[1:0] == 2'd\,0 \\ (acsu[B] == TOP): & \text{for case}[1:0] == 2'd\,1 \\ (acsu[C] == BOT): & \text{for case}[1:0] == 2'd\,2 \end{cases}$$

$$ctr[D] = \begin{cases} (acsu[G] == BOT): & \text{for case}[1:0] == 2'd\,0 \\ (acsu[F] == TOP): & \text{for case}[1:0] == 2'd\,1 \\ (acsu[D] == TOP): & \text{for case}[1:0] == 2'd\,2 \end{cases}$$

$$ctr[E] = \begin{cases} (acsu[B] == TOP): & \text{for case}[1:0] == 2'd\,0 \\ (acsu[C] == BOT): & \text{for case}[1:0] == 2'd\,1 \\ (acsu[E] == BOT): & \text{for case}[1:0] == 2'd\,2 \end{cases}$$

$$ctr[F] = \begin{cases} (acsu[D] == TOP): & \text{for case}[1:0] == 2'd\,0 \\ (acsu[G] == BOT): & \text{for case}[1:0] == 2'd\,1 \\ (acsu[F] == TOP): & \text{for case}[1:0] == 2'd\,2 \end{cases}$$

$$ctr[G] = \begin{cases} (acsu[F] == TOP): & \text{for case}[1:0] == 2'd\,0 \\ (acsu[D] == TOP): & \text{for case}[1:0] == 2'd\,1 \\ (acsu[G] == BOT): & \text{for case}[1:0] == 2'd\,2 \end{cases}$$

$$ctr[H] = (acsu[H] == TOP)$$

The 8-state SPE features a total flip-flop switching activity of 2·L (instead of 3.5·L for the conventional register exchange) for an 8-state SPM of depth L (for a reduction of about 43%).

Generally, an N-state SPE of depth L features a total flip-flop switching activity of $$\frac{NL}{4},$$

while the conventional RE has a flip-flop switching activity of $$\frac{N-1}{2}L.$$

This comparison, however, does not consider the increased Column complexity due to a larger number of multiplexers.

Input-Dependent Pointer Exchange

As previously indicated, one aspect of the present invention reduces the dynamic power consumption of a survivor path memory implementing the register exchange algorithm for certain states. While the systematic pointer exchange scheme discussed above improves power consumption by exchanging pointers to registers instead of exchanging the contents of the registers in a systematic manner, a further variation, referred to as input-dependent pointer exchange, exchanges pointers based on the SPM input values. The pointer exchange replaces all required register exchange operations, and thus the overall dynamic power consumption is reduced. The remaining register copying operations are facilitated by a customized crossbar that is optimized for area.

The disclosed input-dependent pointer exchange scheme features lower switching activity than conventional register exchange techniques and the systematic pointer exchange scheme discussed above. Like the trace-back algorithm, the input-dependent pointer exchange scheme requires only one latch per memory bit, while conventional register exchange techniques and the systematic pointer exchange scheme discussed above require one flip-flop (i.e., two latches) per memory bit (at the expense of a more complex crossbar than the systematic pointer exchange scheme).

A. 4-State Radix-2

Figure 12:
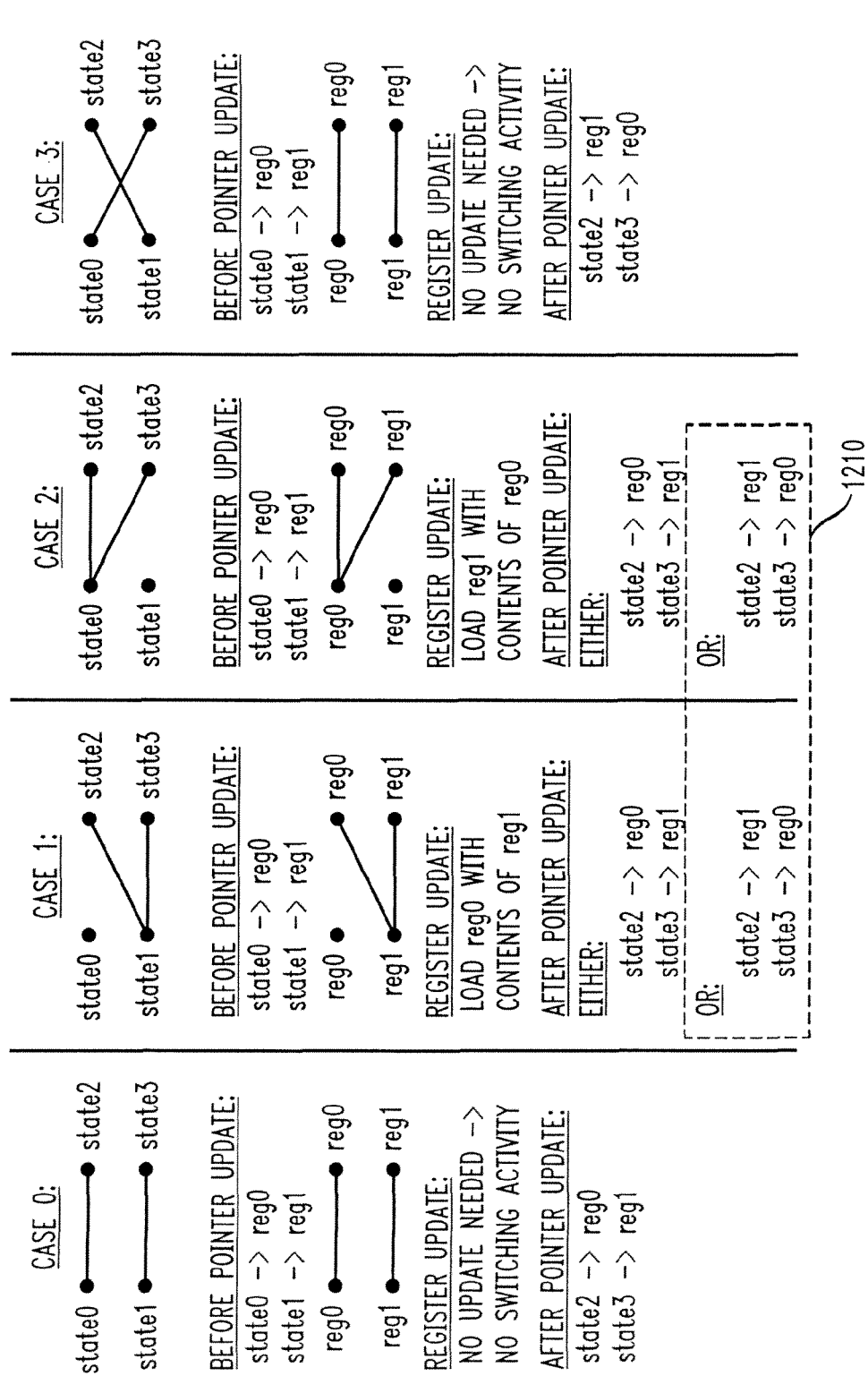
FIG. 12 is a table describing the input-dependent pointer exchange technique by defining the pointer update and register update for four cases.

As discussed above in conjunction with FIG. 6, a 4-state radix-2 trellis can be decomposed into two butterfly sub-trellises, 620-1, 620-2. For each sub-trellis 620, there are four cases (i.e., transition types), that are illustrated in table 1200 of FIG. 12. As shown in FIG. 12, the table 1200 describes the input-dependent pointer exchange technique by defining the pointer update and register update for all four cases. The four labels state0, state1, state2, state3 are placeholders for the respective states. Thus, for example, for the upper sub-trellis 620-1 of FIG. 6, state0 equals State A, state1 equals State C, state2 equals State A, and state3 equals State B.

It is noted that the bottom portion 1210 of FIG. 12 recognizes that the registers contain the same values and the alternate pointer update rules may thus optionally be employed.

The main difference between the input-dependent pointer exchange and the systematic pointer exchange described above is that the input-dependent pointer exchange doesn't produce switching activity for Case 3 because the pointers rather than the registers are exchanged in Case 3.

The switching activities for the input-dependent pointer exchange can be described as follows. In Case 0 and Case 3, only the pointers are updated, but not the registers. Thus, there is no switching activity for these registers in Case 0 and 3. Only in Cases 1 and 2, one of the two registers has a switching activity of 0.5 (provided that the probability that both register bits are identical is 0.5). Thus, the combined switching activity of both registers is 0.5 for Cases 1 and 2 and 0 for Cases 0 and 4. Provided that all four cases have the same probability, the total switching activity of both registers is $\alpha_{reg0} + \alpha_{reg1} = 0.25$. Since an N-state radix-2 trellis contains $$\frac{N}{2}$$

butterfly sub-trellises 620, the total switching activity for such a trellis equals $$\frac{NL}{8},$$

which is a 50% reduction over the systematic pointer exchange scheme. It is noted that this comparison does not account for the increased column complexity due to a more complex multiplexer crossbar.

The input-dependent pointer exchange implementation recognizes that latches (instead of flip-flops) can be used for each memory bit, because it never happens that any register is loaded with a new value and, at the same time during the same clock cycle, the same register is used as a source for updating another register.

Figure 13:
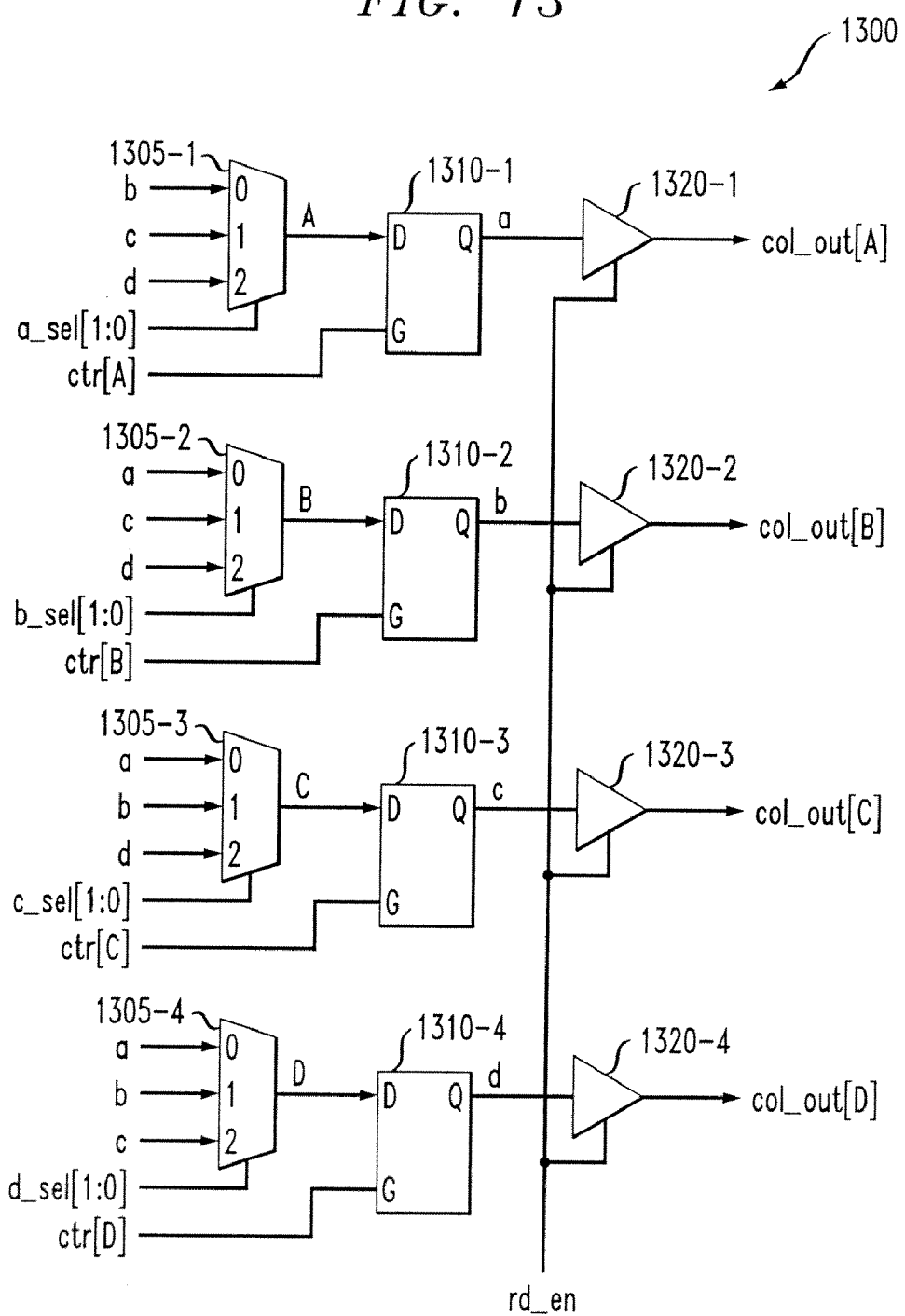
FIG. 13 illustrates an exemplary circuit implementing a column of a 4-state survivor path memory.

FIG. 13 illustrates an exemplary circuit 1300 implementing a column of a 4-state survivor path memory. For ease of illustration, the logic associated with the wr_en input is again not shown.

Figures 14, 15:
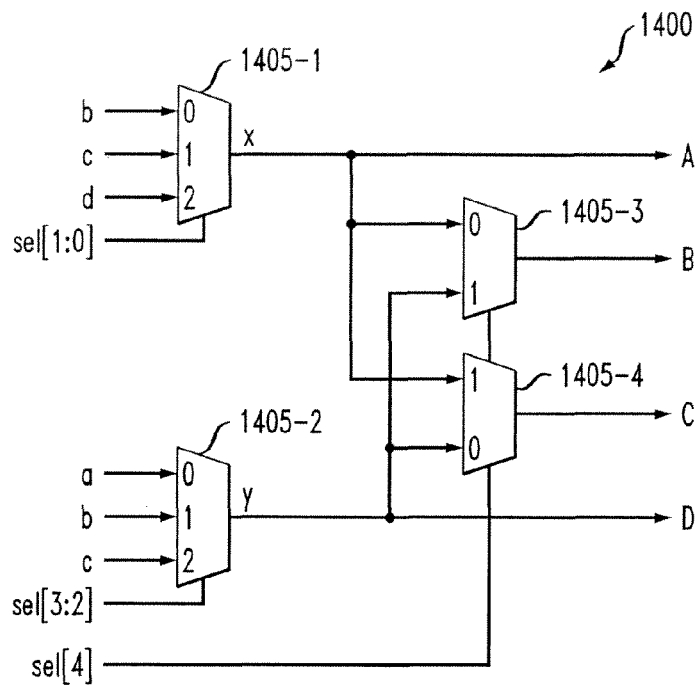
FIG. 14 illustrates an improved crossbar requiring fewer select signals and fewer transistors.
FIG. 15 is a table identifying the required connections for the input-dependent case of only one connection.

The four multiplexers 1305-1 through 1305-4 of FIG. 13 form a crossbar. FIG. 14 illustrates an improved crossbar 1400 that requires fewer select signals and fewer transistors. This two-stage crossbar exploits the fact that the maximum number of simultaneous register copy operations is two. As shown in FIG. 14, the first stage of the crossbar provides those two connections through the two signals x and y.

The improved crossbar 1400 of FIG. 14 has been derived by considering only the connections that are really required by the input-dependent pointer exchange scheme. There are either one or two connections required. For both cases, all required connections are listed in the following: (Note that the inputs of the crossbar 1400 are denoted by lower case letters a, b, c, d, and the outputs of the crossbar 1400 by upper case letters A, B, C, D).

FIG. 15 is a table 1500 identifying the required connections for the input-dependent case of only one connection (i.e., only one of the two sub-trellises is in Case 1 or 2 (see FIG. 12). It is noted that the connection j→J (where j=a,b,c,d and J=A,B,C,D) is not required.

Figures 16, 17:
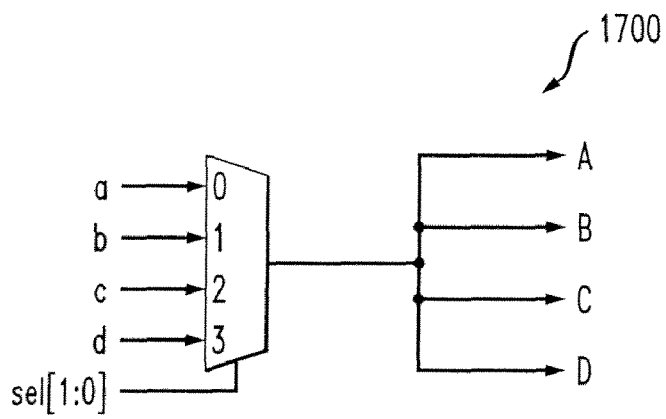
FIG. 16 is a table identifying the required connections for the input-dependent case of two simultaneous connections.
FIG. 17 illustrates a crossbar for a special case.

FIG. 16 is a table 1600 identifying the required connections for the input-dependent case of two simultaneous connections (i.e., both sub-trellises are in Case 1 or 2, see FIG. 12). In this case, two out of the four inputs (e.g., a and b) are applied to the remaining two outputs (for this example, C and D). Thus, the connection pair i→J, k→L is only required for i≠k≠J≠L.

It is sufficient if the crossbar 1400 supports only one of the two connection pairs listed in each row of the above table. For example, the two connection pairs of the first row are a->C, b→D and a→D, b→C. If the crossbar supports only one of the connection pairs, then the other connection pair can also be implemented by simply exchanging the pointers that point to C and D. For example, the crossbar 1400 shown in FIG. 14 does not support the connections a→C, b→D, but the crossbar 1400 supports a→D, b→C. The connection pairs marked in FIG. 16 by (#) are supported by the crossbar 1400 shown in FIG. 14.

B. Optimized Crossbar For Special Case

FIG. 17 illustrates a crossbar 1700 for a special case. Thus far, it has been assumed that there is only one clock cycle available for each trellis transition step k. The crossbar 1700 applies in a special case where two clock cycles are available for each transition step k, i.e., the clock frequency of the survivor path memory is twice as high as the throughput of the survivor path memory. In this special case, each memory column has two clock cycles to perform up to two register copy operations for each step k. This can be accomplished by the multiplexer 1700 of FIG. 17, which can process up to one register copy operation per each clock cycle.

C. Trellis Collapsing

A further optimization for the general input-dependent pointer exchange scheme can be obtained through trellis collapsing. The advantages of this trellis collapsing optimization include lower switching activity and a simpler crossbar, while its drawback is higher latency. Generally, trellis collapsing combines two or more trellis steps k, k+1 over two or more clock cycles and then the resulting register copy operations are consolidated, so as to reduce switching activity and crossbar complexity.

i. Two-Step Trellis Collapsing

Figure 18:
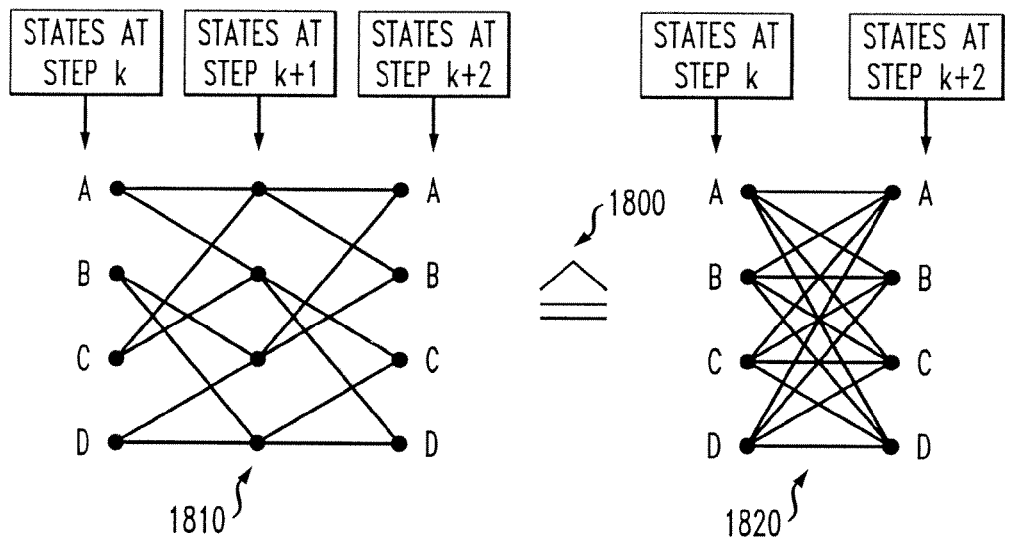
FIGS. 18 through 20 illustrate the trellis collapsing of a 4-state radix-2 trellis into a 2-step 4-state radix-4 trellis.

First, the consolidation of two consecutive trellis steps are considered. As shown in Gerhard Fettweis and Heinrich Meyr, "Parallel Viterbi Algorithm Implementation: Breaking the ACS-Bottleneck," IEEE Trans. on Communications, Vol. 37, No. 8 (August 1989), the one-step 4-state radix-2 trellis can be "collapsed" to a 2-step 4-state radix-4 trellis, as illustrated in FIG. 18. FIG. 18 illustrates the trellis collapsing of a 4-state radix-2 trellis 1810 into a 2-step 4-state radix-4 trellis 1820.

Figure 19:
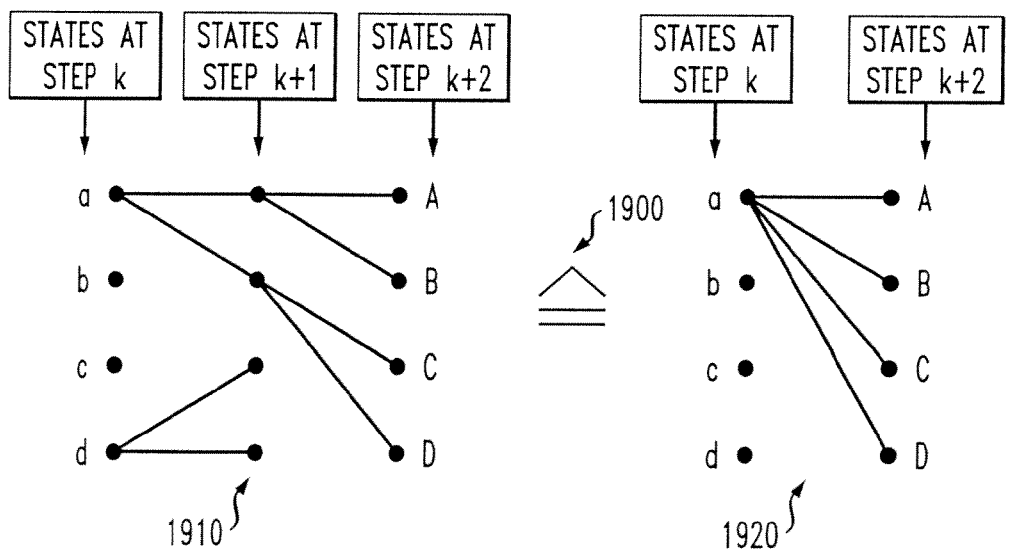

FIG. 19 illustrates the worst-case radix-4 trellis 1910 resulting in the maximum number of register copy operations, which is three per two trellis steps (these copy operations are a→B, a→C, and a→D). Note that the above described input-dependent pointer exchange requires up to four register copy operations per two trellis steps. Thus, the consolidation of two trellis steps results in a switching activity reduction of 25% for the worst case trellis 1910 shown in FIG. 19. Note that this worst case still requires a crossbar that is able to copy up to two register contents, such as the crossbar shown in FIG. 14.

Figure 20:
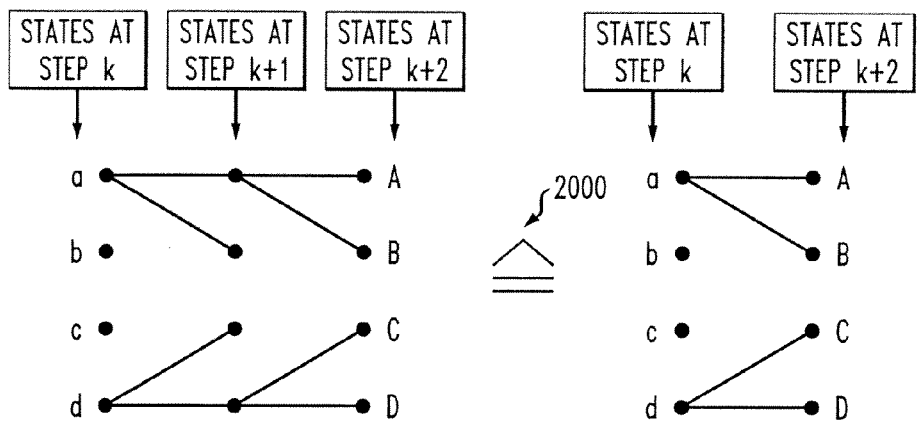

There are additional cases that result in lower switching activity after the consolidation of two trellis steps. For example, the consolidation of copy operations for the case shown in FIG. 20 results in a 50% switching activity reduction.

ii. Three-Step Trellis Collapsing

Figure 21:
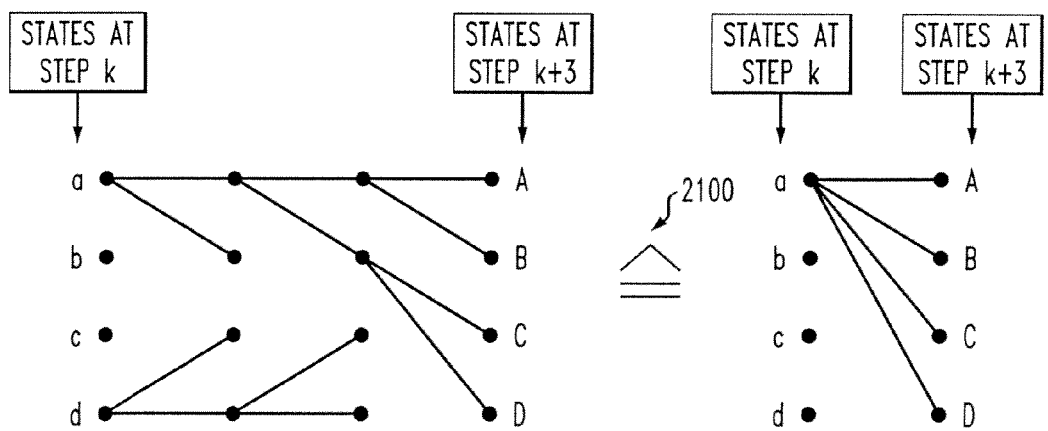
FIG. 21 illustrates a three-step 4-state radix-4 trellis that results from consolidating three trellis steps.

Consolidating three trellis steps results in a three-step 4-state radix-4 trellis. The worst-case 2100 for three-step trellis collapsing shown in FIG. 21 requires three register copy operations per three trellis steps (or per three clock cycles). Thus, this worst case requires a crossbar that is able to perform only one copy operation per clock cycle, such as the crossbar shown in FIG. 17.

FIG. 22 is a table 2200 summarizing the advantages of the multi-step trellis collapsing. Note that these advantages come at the expense of a higher survivor path memory latency. For each number of consolidated clock cycles indicated in column 2210, the table 2200 identifies the maximum number of copy operations for each group of consolidated clock cycles in column 2220, the switching activity reduction for the worst case in column 2230, and the crossbar type in column 2240.

FIG. 23 is a table 2300 illustrating a trellis collapsing for an exemplary 8-state trellis. For each number of consolidated clock cycles indicated in column 2310, the table 2300 identifies the maximum number of copy operations for each group of consolidated clock cycles in column 2320 and the maximum number of copy operations the crossbar must be able to perform per each clock cycle in column 2330.

Among other benefits, the present invention lowers the dynamic power consumption, relative to conventional register exchange implementations and demonstrates the same latency and throughput as the register exchange algorithm.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A survivor path memory for a Viterbi detector, comprising:

a plurality of columns, each of said columns associated with a different time step, each of said columns comprising:

a memory element for storing one bit or portion of a bit sequence associated with a Viterbi state, each of said memory elements having at least one data input; and a switch for each state controlled by a case signal indicating a time step, said switch selecting a state from a previous time step, wherein an output of said switch of a given state is connected to said at least one data input of a memory element of said given state; and an input processor for generating a control signal that exchanges one or more pointers based on a trellis structure, wherein each of said pointers points to one of said memory elements.

2. The survivor path memory of claim 1, wherein one or more of said states maintain values and wherein said associated pointers are maintained in said associated memory elements.

3. The survivor path memory of claim 1, wherein one or more of said memory elements are updated based on a value of a write enable signal.

4. The survivor path memory of claim 1, wherein an output of each of said memory elements is stored in a corresponding buffer, and wherein said buffer contents are read based on a value of a read enable signal.

5. The survivor path memory of claim 1, wherein one or more of said memory elements are updated based on a value provided by an input processor.

6. The survivor path memory of claim 1, wherein said trellis structure comprises one or more butterfly trellises.

7. The survivor path memory of claim 1, wherein said trellis structure has been collapsed to combine a plurality of steps into a single step.

8. The survivor path memory of claim 1, wherein one or more of said states do not change values and wherein said associated pointers are not updated by said one or more predefined rules.

* * * * *